(12) United States Patent
Hoyer et al.

(10) Patent No.: US 10,262,973 B1
(45) Date of Patent: Apr. 16, 2019

(54) MODULAR CHIP WITH REDUNDANT INTERFACES

(71) Applicant: Marvell International Ltd., Hamilton (BM)

(72) Inventors: Claus F. Hoyer, Espergaerde (DK); Thomas Povlsen, Kgs Lyngby (DK)

(73) Assignee: Marvell International Ltd., Hamilton (BM)

( * ) Notice: Subject to any disclaimer, the term of this patent is extended or adjusted under 35 U.S.C. 154(b) by 86 days.

(21) Appl. No.: 15/369,384

(22) Filed: Dec. 5, 2016

Related U.S. Application Data

(60) Provisional application No. 62/262,569, filed on Dec. 3, 2015, provisional application No. 62/290,003, filed on Feb. 2, 2016.

(51) Int. Cl.
| | |
|---|---|
| *G06F 1/26* | (2006.01) |
| *G11C 8/02* | (2006.01) |
| *G06F 3/06* | (2006.01) |
| *G11C 11/40* | (2006.01) |
| *H02M 1/36* | (2007.01) |
| *H03K 17/00* | (2006.01) |
| *H01L 25/065* | (2006.01) |
| *H01L 25/00* | (2006.01) |
| *H01L 23/538* | (2006.01) |
| *H01L 23/00* | (2006.01) |
| *H03M 9/00* | (2006.01) |

(52) U.S. Cl.
CPC ...... *H01L 25/0655* (2013.01); *H01L 23/5386* (2013.01); *H01L 24/48* (2013.01); *H01L 25/50* (2013.01); *H01L 2224/4805* (2013.01); *H01L 2224/48137* (2013.01); *H03M 9/00* (2013.01)

(58) Field of Classification Search
CPC . H01L 25/0655; H01L 23/5386; H01L 24/48; H01L 25/50; H01L 2224/4805; H01L 2224/48137; H03M 9/00
USPC .................................................. 327/524–602
See application file for complete search history.

(56) References Cited

U.S. PATENT DOCUMENTS

| | | | | |
|---|---|---|---|---|
| 9,112,601 | B2* | 8/2015 | Gao | H04B 10/40 |
| 9,152,495 | B2* | 10/2015 | Losh | G06F 11/1008 |
| 9,240,220 | B2* | 1/2016 | Vorbach | G11C 5/02 |
| 9,626,470 | B2* | 4/2017 | Emirian | G06F 17/5054 |
| 9,891,653 | B2* | 2/2018 | Ng | G06F 1/10 |
| 2012/0319717 | A1* | 12/2012 | Chi | G01R 31/318513 |
| | | | | 324/756.05 |
| 2014/0049932 | A1* | 2/2014 | Camarota | H01L 23/145 |
| | | | | 361/807 |
| 2016/0239461 | A1* | 8/2016 | Kavipurapu | G06F 9/4494 |
| 2016/0300816 | A1* | 10/2016 | Park | H01L 25/0657 |
| 2016/0373138 | A1* | 12/2016 | Li | H03M 13/353 |

(Continued)

*Primary Examiner* — Brandon S Cole (57) ABSTRACT

Aspects of the disclosure provide a chip package that includes a first die and a second die. The first die has a processing circuit and a first interface circuit. The second die is disposed in a proximity to the first die and coupled to the first die. The second die includes internal functional circuits, two or more second interface circuits with an identical configuration, and a switch circuit. A specific second interface circuit is electrically connected to the first interface circuit via wires. The switch circuit is configured to select the specific second interface circuit from the two or more second interface circuits, and couple the specific second interface circuit to the internal functional circuits on the second die.

22 Claims, 7 Drawing Sheets

(56) References Cited

U.S. PATENT DOCUMENTS

2017/0104406 A1* 4/2017 Kim .................. H02M 1/36
2017/0147367 A1* 5/2017 Alley ................ G06F 13/4221
2017/0228167 A1* 8/2017 Manohar ............ G06F 3/0688

* cited by examiner

MODULAR CHIP WITH REDUNDANT INTERFACES

INCORPORATION BY REFERENCE

This present disclosure claims the benefit of U.S. Provisional Application No. 62/262,569, "OPTIMIZING MODULAR CHIP USING REDUNDANT DISC-TO-DIE-INTERFACES" filed on Dec. 3, 2015, and U.S. Provisional Application No. 62/290,003, "OPTIMIZING MODULAR CHIPS USING REDUNDANT DIE-TO-DIE INTERFACES" filed on Feb. 2, 2016, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Modular chip approach is used to achieve cost reduction for a system compared to a monolithic approach (e.g., system-on-chip), in which multiple components and functions are all disposed on a single chip. In a modular chip example, functions of a system are split into modular chips having specific functions for optimized cost. The modular chips are manufactured respectively according to optimized semiconductor manufacturing process technology. Then the modular chips are connected with each other for example in a chip package. In an example, the chip package achieves substantially the same overall system performance as the monolithic approach, however at a lower cost compared to the monolithic approach.

SUMMARY

Aspects of the disclosure provide a chip package that includes a first die and a second die. The first die has a processing circuit and a first interface circuit. The second die is disposed in a proximity to the first die and coupled to the first die. The second die includes internal functional circuits, two or more second interface circuits with an identical configuration, and a switch circuit. A specific second interface circuit is electrically connected to the first interface circuit via wires. The switch circuit is configured to select the specific second interface circuit from the two or more second interface circuits, and couple the specific second interface circuit to the internal functional circuits on the second die.

In an embodiment, the first die is a core die, the first interface circuit is one of a plurality of core interface circuits, the second die is a first peripheral die of multiple peripheral dies, the second interface circuits are peripheral interface circuits, and the specific second interface circuit is a specific peripheral interface circuit. In another embodiment, the first die is one of a plurality of peripheral dies, the first interface circuit is a peripheral interface circuit, the second die is a core die, and the second interface circuits are core interface circuits.

Aspects of the disclosure provide a chip package. The chip package includes a core die and a plurality of peripheral dies. The core die includes a processing circuit and a plurality of core interface circuits. The peripheral dies are disposed in a proximity to the core die and are coupled to the core die. At least a first peripheral die includes internal functional circuits, two or more peripheral interface circuits with an identical configuration and a switch circuit. A specific peripheral interface circuit is electrically connected to one of the core interface circuits via wires. The switch circuit is configured to select the specific peripheral interface circuit from the two or more peripheral interface circuits, and couple the specific peripheral interface circuit to the internal functional circuits on the first peripheral die.

In an embodiment, the specific peripheral interface circuit is aligned and connected to the core interface circuit on the core die. In an example, the specific peripheral interface circuit is connected to the core interface circuit on the core die via straight wires.

According to an aspect of the disclosure, the first peripheral die and a second peripheral die are produced with a same layout. The second peripheral die includes corresponding internal functional circuits, corresponding two or more peripheral interface circuits, and corresponding switch circuit. In the second peripheral die, a different peripheral interface circuit is electrically connected to one of the core interface circuits via wires. The corresponding switch circuit is configured to select the different peripheral interface circuit and couple the different peripheral interface circuit to the corresponding internal functional circuits on the second peripheral die.

In an embodiment, the switch circuit is configured to select the specific peripheral interface circuit that passes a test, and couple the specific peripheral interface circuit to the internal functional circuits on the first peripheral die, and decouple another peripheral interface circuit that fails the test.

In an example, the switch circuit includes a multiplexer configured to receive inputs from multiple peripheral interface circuits, select an input from the specific peripheral interface circuit based on a selection signal, and couple the specific peripheral interface circuit to the internal functional circuits on the first peripheral die. In an example, the internal functional circuits are configured to convert between serial data and parallel data.

In an embodiment, the switch circuit is configured to select the specific peripheral interface circuit based on external interconnection configuration of the peripheral interface circuits.

According to an aspect of the disclosure, the processing circuit on the core die is configured to process packets, and the peripheral dies are configured to transmit/receive packets.

Aspects of the disclosure provide a method for producing a chip package. The method includes disposing a plurality of peripheral dies in a proximity to a core die having a processing circuit and a plurality of core interface circuits. At least a first peripheral die includes two or more peripheral interface circuits. Further, the method includes connecting a specific peripheral interface from the two or more peripheral interface circuits to one of the core interface circuits via wires, and configuring a switch circuit in the first peripheral die to couple the specific peripheral interface circuit to internal functional circuits on the first peripheral die.

Aspects of the disclosure provide an integrated circuit (IC) chip. The IC chip includes internal functional circuits, two or more peripheral interface circuits with an identical configuration, and a switch circuit configured to be controllable to select at least one of the peripheral interface circuits, and to couple the selected at least one peripheral interface circuit to the internal functional circuits.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
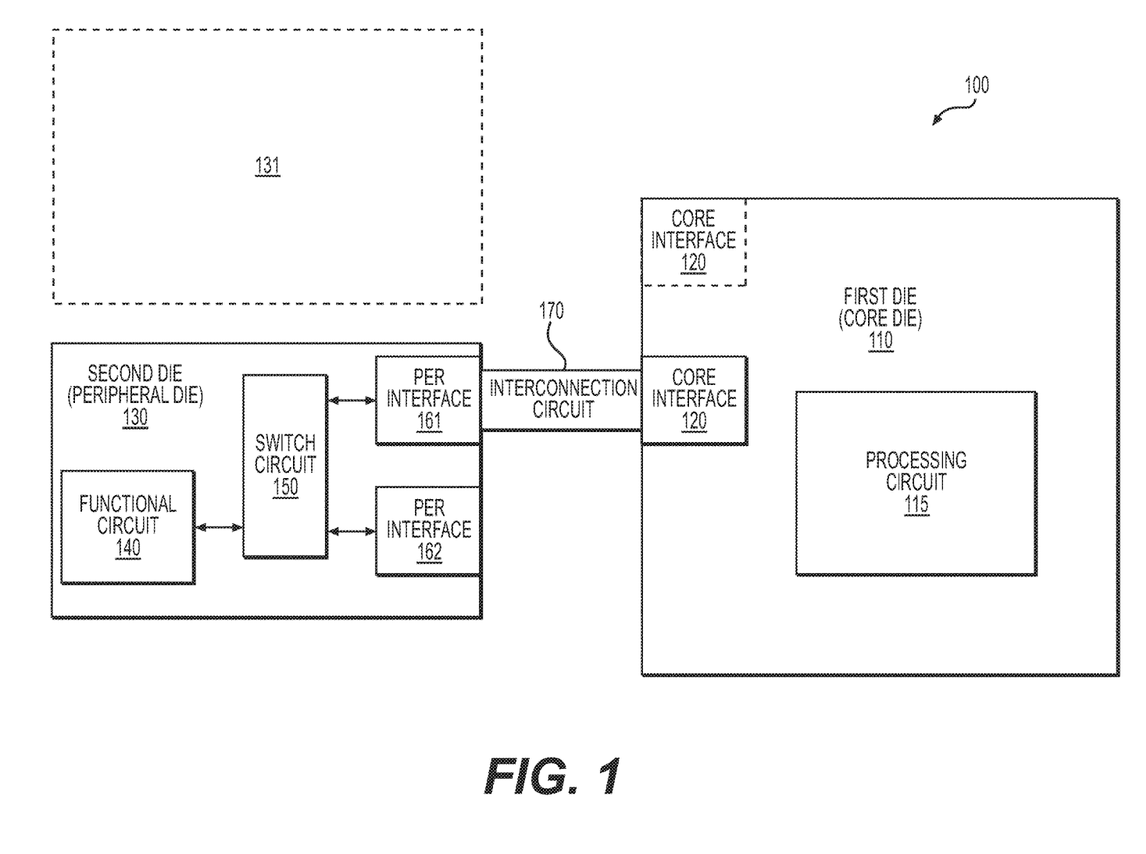
FIG. 1 shows a block diagram of a system 100 according to an embodiment of the disclosure.

FIG. 1 shows a block diagram of a system 100 according to an embodiment of the disclosure. The system 100 includes multiple dies, such as a first die 110, a second die 130 and the like. One of the dies, such as the second die 130, includes multiple interface circuits 161-162, a switch circuit 150 and internal functional circuit 140 coupled together as shown in FIG. 1. The switch circuit 150 is configured to select one of the multiple interface circuits 161-162 and couple the selected interface circuit with the internal functional circuit 140.

According to an aspect of the disclosure, the system 100 is a multiple-die system implemented in a package, and the system 100 achieves comparable overall system performance to a single-die product, such as a system-on-chip (SOC) product. In an embodiment, functions of a SOC product are split into multiple modular chips in order to optimize cost.

In an example, the functions of the SOC product are split into a core die (e.g., the first die 110) for computation, and peripheral dies (e.g., the second die 130, another die 131 and the like) of storage, and the like. In the FIG. 1 example, the first die 110 includes processing circuit 115 configured to perform heavy computation operations. In an example, the processing circuit 115 includes, for example, a central processing unit (CPU), a graphics processing unit (GPU), an application processor, and the like. The first die 110 also includes core interface circuits 120 configured to interface the processing circuit 115 to circuits that are external of the first die 110.

In another example, functions of a network system are split into a core die (e.g., the first die 110) for packet processing, and peripheral dies (e.g., the second die 130, another die 131 and the like) for network interface and the like. In the FIG. 1 example, the processing circuit 115 in the first die 110 includes one or more packet processors configured to perform packet processing. In an example, the one or more packet processors are configured to determine a core interface and a peripheral die coupled to the core interface over which to transmit a received packet to another device in a computer network. The internal functional circuit 140 in the second die 130 includes interface circuits, such as modulation/demodulation circuits, memory circuit for queuing packets, and the like. In an example, the internal functional circuit 140 includes Serializer/Deserializer (SERDES) configured to convert data between serial data and parallel data. For example, the second die 130 is coupled to an external cable (not shown) and configured to perform serial data communication with an external device (not shown) via the cable. The interface circuits 161-162 are parallel interfaces configured to perform parallel data communication with the first die 110.

According to an aspect of the disclosure, the core die and the peripheral dies are manufactured respectively using suitable manufacturing process that is optimized, e.g to improve respective yield, performance, die cost etc., and thus the cost for the system 100 is reduced without necessarily reducing performance. Further, the core die and the peripheral dies are coupled together by interconnection circuits according to package technology to form the system 100 in a package. In the FIG. 1 example, an interconnection circuit 170 couples the peripheral interface 161 with the core interface 120. In an example, the interconnection circuit 170 is configured to have characteristics for high speed transmission between dies in the package; for instance a shortest routing between dies is selected. Thus, the system 100 achieves comparable overall performance as the SOC product, and achieves low cost.

According to an aspect of the disclosure, in order to achieve high speed transmission, the interconnection circuit 170 is configured to have a straight interconnection characteristic that uses straight wires with minimize wire length for signal transmission between dies. In an example, the straight wires are referred to as a comparatively short routing technology between interfaces of the peripheral die and the core die relative to other combinations of interconnections between peripheral interface circuits and core interface circuits. However, due to various limitations (e.g., space limitation, aspect ratio limitation, peripheral dies placement limitation, and the like), the placement of dies lacks flexibility, and to align interface circuits in the first die 110 with single peripheral interface circuit of the peripheral dies is difficult to achieve when each peripheral die includes a single peripheral interface circuit. It is noted that, conventionally, multiple versions of second die 130 are manufactured in which each respective version an interface circuit is disposed at a different location within the second die. The manufacture of multiple versions typically leads to additional cost and logistics complications.

According to the disclosure, the peripheral dies are configured to have multiple peripheral interface circuits to ease die placement efforts and enable fast speed interconnection circuits. For example, the second die 130 has multiple peripheral interface circuits 161-162, and when any one of the peripheral interface circuits 161-162 is aligned with (e.g., located in front of) the core interface circuit 120, the interconnection circuit with minimum wire length can be used to couple the core interface circuit 120 and the peripheral interface circuit to allow high speed transmission between dies. In addition, the switch circuit 150 is configured to select the peripheral interface circuit that is most aligned with the core interface 120, and couple the selected peripheral interface circuit with the internal functional circuit 140.

For example, when a die placement of the system 100 allows the peripheral interface circuit 161 to be aligned with the core interface 120 as illustrated in FIG. 1, the interconnection circuit 170 is formed to couple the peripheral interface circuit 161 to the core interface circuit 120 with shortest wires for fast speed transmission. However, when a die placement of the system does not allow the peripheral interface circuit 161 to be aligned with the core interface circuit 120, but allows the peripheral interface circuit 162 to be aligned with the core interface circuit 120 (not shown in FIG. 1), the interconnection circuit 170 is formed to couple the peripheral interface circuit 162 to the core interface circuit 120 with shortest wires for fast speed transmission.

According to another aspect of the disclosure, an interface circuit, for example the peripheral interface circuit 162, or an external component (e.g., wires, external circuit components) coupled to the peripheral interface circuit 162, is defective, and another interface circuit, for example the interface circuit 161 is non-defective. When the first die 110 and the second die 130 are disposed in a package, the interface circuit 161 is aligned with the core interface 120, and interconnection circuit 170 is formed to interconnect the interface circuit 161 with the core interface circuit 120. Then, the switch circuit 150 is configured to select the non-defective interface circuit, such as the interface circuit 161, and couple the non-defective interface circuit to the internal functional circuit 140. Thus, due to the redundancy of the interface circuits, the effective yield for the second die 130 increases.

Figure 2:
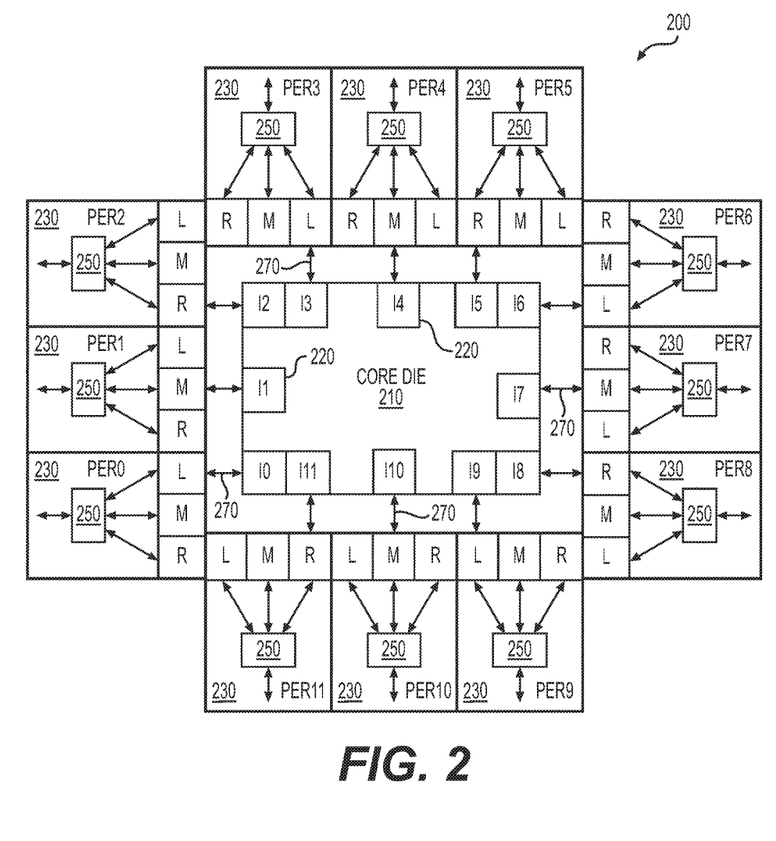
FIG. 2 shows a block diagram of a system 200 implemented using modular chips according to an embodiment of the disclosure.

FIG. 2 shows a block diagram of a system 200 implemented using modular chips according to an embodiment of the disclosure. In the FIG. 2 example, the system 200 includes a core die 210 and twelve peripheral dies 230 (PER0-PER11) coupled together as seen in FIG. 2.

According to an aspect of the disclosure, the system 200 is implemented in a chip package, and is used in a network switch device. In an example, functions of a network switch device are split into the core die 210 for packet processing, and peripheral dies 230 as network interface circuits. In an application example, the peripheral dies 230 are coupled to other devices (not shown), such as computers, network switches and the like via cables for example. The peripheral dies 230 are configured to receive, for example packets from the other devices via the cables, and transmit packets to the other device via the cables.

According to an aspect of the disclosure, the core die 210 includes a packet processor (not shown) and twelve core interface circuits I0-I11. The core interface circuits I0-I11 are configured to interface the core die 210 with external components, such as interconnections 270, the peripheral dies 230, and the like. In an example, the peripheral dies 230 are of the same design, thus simplifying manufacturing logistics, in an embodiment. For example, each peripheral die 230 includes functional circuits (not shown), a switch circuit 250 and a plurality of peripheral interface circuits (e.g., peripheral interface circuit L, peripheral interface circuit M and peripheral interface circuit R). The switch circuit 250 is configured to select one of the peripheral interface circuits L-M-R, and couple the selected peripheral interface circuit to the functional circuits. Although three peripheral interface circuits L-M-R are seen, it is noted that a greater or lesser number of peripheral interface circuits are provided in other embodiments.

According to an aspect of the disclosure, the core die 210 interfaces a relatively large number of peripheral dies 230, such as twelve in the FIG. 2 example. In order to maintain a relatively small size of the core die 210, the placement of the peripheral dies 230 lacks flexibility. The peripheral dies 230 are configured to have multiple interface circuits to increase the flexibility to allow straight wire interconnections, and one of the interface circuits that is aligned to a corresponding core interface circuit is selectively coupled to the functional circuit.

Specifically, in the FIG. 2 example, due to the redundant interface circuits in each peripheral die, straight interconnections 270 are formed between the core die 210 and each of the peripheral dies 230. For example, a straight interconnection 270 is formed between the core interface circuit I0 and the peripheral interface circuit L of the peripheral die PER0 and the switch circuit 250 in the peripheral die PER0 is configured to select the peripheral interface circuit L and couple the peripheral interface circuit L to the functional circuit (not shown) in the peripheral die PER0.

Similarly, a straight interconnection 270 is formed between the core interface circuit I1 and the peripheral interface circuit M of the peripheral die PER1 and the switch circuit 250 in the peripheral die PER1 is configured to select the peripheral interface circuit M and couple the peripheral interface circuit M to functional circuit (not shown) in the peripheral die PER1.

A straight interconnection 270 is formed between the core interface circuit I2 and the peripheral interface circuit R of the peripheral die PER2 and the switch circuit 250 in the peripheral die PER2 is configured to select the peripheral interface circuit R and couple the peripheral interface circuit R to functional circuit (not shown) in the peripheral die PER2.

A straight interconnection 270 is formed between the core interface circuit I3 and the peripheral interface circuit L of the peripheral die PER3 and the switch circuit 250 in the peripheral die PER3 is configured to select the peripheral interface circuit L and couple the peripheral interface circuit L to functional circuit (not shown) in the peripheral die PER3.

A straight interconnection 270 is formed between the core interface circuit I4 and the peripheral interface circuit M of the peripheral die PER4 and the switch circuit 250 in the peripheral die PER4 is configured to select the peripheral interface circuit M and couple the peripheral interface circuit M to functional circuit (not shown) in the peripheral die PER4.

A straight interconnection 270 is formed between the core interface circuit I5 and the peripheral interface circuit R of the peripheral die PER5 and the switch circuit 250 in the peripheral die PER5 is configured to select the peripheral interface circuit R and couple the peripheral interface circuit R to functional circuit (not shown) in the peripheral die PER5.

A straight interconnection 270 is formed between the core interface circuit I6 and the peripheral interface circuit L of the peripheral die PER6 and the switch circuit 250 in the peripheral die PER6 is configured to select the peripheral interface circuit L and couple the peripheral interface circuit L to functional circuit (not shown) in the peripheral die PER6.

A straight interconnection 270 is formed between the core interface circuit I7 and the peripheral interface circuit M of the peripheral die PER7 and the switch circuit 250 in the peripheral die PER7 is configured to select the peripheral interface circuit M and couple the peripheral interface circuit M to functional circuit (not shown) in the peripheral die PER7.

A straight interconnection 270 is formed between the core interface circuit I8 and the peripheral interface circuit R of the peripheral die PER8 and the switch circuit 250 in the peripheral die PER8 is configured to select the peripheral interface circuit R and couple the peripheral interface circuit R to functional circuit (not shown) in the peripheral die PER8.

A straight interconnection 270 is formed between the core interface circuit I9 and the peripheral interface circuit L of the peripheral die PER9 and the switch circuit 250 in the peripheral die PER9 is configured to select the peripheral interface circuit L and couple the peripheral interface circuit L to functional circuit (not shown) in the peripheral die PER9.

A straight interconnection 270 is formed between the core interface circuit I10 and the peripheral interface circuit M of the peripheral die PER10 and the switch circuit 250 in the peripheral die PER10 is configured to select the peripheral interface circuit M and couple the peripheral interface circuit M to functional circuit (not shown) in the peripheral die PER10.

A straight interconnection 270 is formed between the core interface circuit I11 and the peripheral interface circuit R of the peripheral die PER11 and the switch circuit 250 in the peripheral die PER11 is configured to select the peripheral interface circuit R and couple the peripheral interface circuit R to functional circuit (not shown) in the peripheral die PER11.

In the FIG. 2 example, due to the redundant interface circuits, the straight interconnections 270 are formed with flexibility, and the core die 210 is implemented with a reduced die size. Further, due to the same design of the peripheral dies, the reticle utilization increases, and die cost is reduced.

It is noted that, in an example, the core interface circuits I0-I12 are positioned differently from FIG. 2. For example, the core interface circuits I10 is positioned to be aligned with the peripheral interface circuit L in the peripheral die PER10 instead of the peripheral interface circuit M as shown in FIG. 2.

Figure 3:
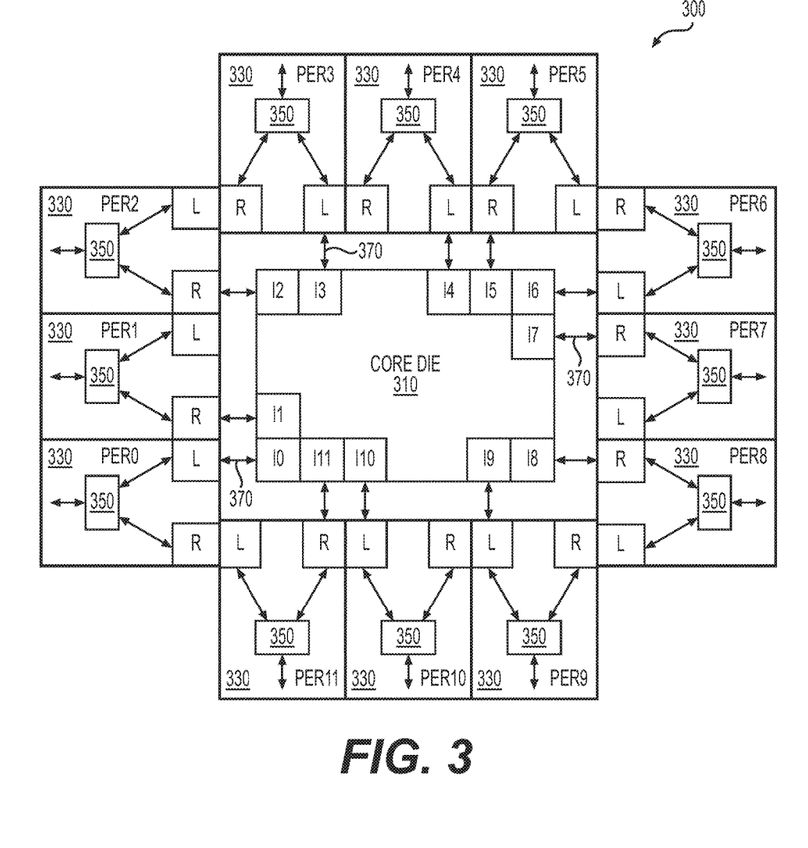
FIG. 3 shows a block diagram of another system 300 implemented using modular chips according to an embodiment of the disclosure.

It is also noted that the system 200 can be modified to reduce redundancy, such as an example shown in FIG. 3.

FIG. 3 shows a block diagram of another system 300 implemented using modular chips according to an embodiment of the disclosure. Similarly to the system 200, the system 300 includes a core die 310 and twelve peripheral dies 330 coupled together as shown in FIG. 3.

Similarly to the system 200, in an embodiment, the system 300 is implemented in a chip package, and is used in a network switch device. In an example, functions of a network switch device are split into the core die 310 for packet processing, and peripheral dies 330 as network interface circuits. In an application example, the peripheral dies 330 are coupled to other devices (not shown), such as computers, network switches and the like via cables for example. The peripheral dies 330 are configured to receive, for example packets from the other devices via the cables, and transmit packets to the other device via the cables.

According to an aspect of the disclosure, the core die 310 includes a packet processor (not shown) and twelve core interface circuits I0-I11. The core interface circuits I0-I11 are configured to interface the core die 310 with external components, such as interconnections 370, the peripheral dies 330, and the like. In an example, the peripheral dies 330 are of the same design. For example, each peripheral die 330 includes functional circuit (not shown), a switch circuit 350 and two peripheral interface circuits L and R. The switch circuit 350 is configured to select one of the peripheral interface circuits L and R, and couple the selected peripheral interface circuit to the functional circuit.

For example, a straight interconnection 370 is formed between the core interface circuit I0 and the peripheral interface circuit L of the peripheral die PER0 and the switch circuit 350 in the peripheral die PER0 is configured to select the peripheral interface circuit L and couple the peripheral interface circuit L to functional circuit (not shown) in the peripheral die PER0.

Similarly, a straight interconnection 370 is formed between the core interface circuit I1 and the peripheral interface circuit R of the peripheral die PER1 and the switch circuit 350 in the peripheral die PER1 is configured to select the peripheral interface circuit R and couple the peripheral interface circuit R to functional circuit (not shown) in the peripheral die PER1.

A straight interconnection 370 is formed between the core interface circuit I2 and the peripheral interface circuit R of the peripheral die PER2 and the switch circuit 350 in the peripheral die PER2 is configured to select the peripheral interface circuit R and couple the peripheral interface circuit R to functional circuit (not shown) in the peripheral die PER2.

A straight interconnection 370 is formed between the core interface circuit I3 and the peripheral interface circuit L of the peripheral die PER3 and the switch circuit 350 in the peripheral die PER3 is configured to select the peripheral interface circuit L and couple the peripheral interface circuit L to functional circuit (not shown) in the peripheral die PER3.

A straight interconnection 370 is formed between the core interface circuit I4 and the peripheral interface circuit L of the peripheral die PER4 and the switch circuit 350 in the peripheral die PER4 is configured to select the peripheral interface circuit L and couple the peripheral interface circuit L to functional circuit (not shown) in the peripheral die PER4.

A straight interconnection 370 is formed between the core interface circuit I5 and the peripheral interface circuit R of the peripheral die PER5 and the switch circuit 350 in the peripheral die PER5 is configured to select the peripheral interface circuit R and couple the peripheral interface circuit R to functional circuit (not shown) in the peripheral die PER5.

A straight interconnection 370 is formed between the core interface circuit I6 and the peripheral interface circuit L of the peripheral die PER6 and the switch circuit 350 in the peripheral die PER6 is configured to select the peripheral interface circuit L and couple the peripheral interface circuit L to functional circuit (not shown) in the peripheral die PER6.

A straight interconnection 370 is formed between the core interface circuit I7 and the peripheral interface circuit R of the peripheral die PER7 and the switch circuit 350 in the peripheral die PER7 is configured to select the peripheral interface circuit R and couple the peripheral interface circuit R to functional circuit (not shown) in the peripheral die PER7.

A straight interconnection 370 is formed between the core interface circuit I8 and the peripheral interface circuit R of the peripheral die PER8 and the switch circuit 350 in the peripheral die PER8 is configured to select the peripheral interface circuit R and couple the peripheral interface circuit R to functional circuit (not shown) in the peripheral die PER8.

A straight interconnection 370 is formed between the core interface circuit I9 and the peripheral interface circuit L of the peripheral die PER9 and the switch circuit 350 in the peripheral die PER9 is configured to select the peripheral interface circuit L and couple the peripheral interface circuit L to functional circuit (not shown) in the peripheral die PER9.

A straight interconnection 370 is formed between the core interface circuit I10 and the peripheral interface circuit L of the peripheral die PER10 and the switch circuit 350 in the peripheral die PER10 is configured to select the peripheral interface circuit L and couple the peripheral interface circuit L to functional circuit (not shown) in the peripheral die PER10.

A straight interconnection 370 is formed between the core interface circuit I11 and the peripheral interface circuit R of the peripheral die PER11 and the switch circuit 350 in the peripheral die PER11 is configured to select the peripheral interface circuit R and couple the peripheral interface circuit R to functional circuit (not shown) in the peripheral die PER11.

It is noted that, in another example, the core interface circuits I0-I12 are positioned differently from FIG. 3. For example, the core interface circuit I10 is positioned to be aligned with the peripheral interface circuit R in the peripheral die PER10 instead of the peripheral interface circuit L shown in FIG. 3.

Figure 4:
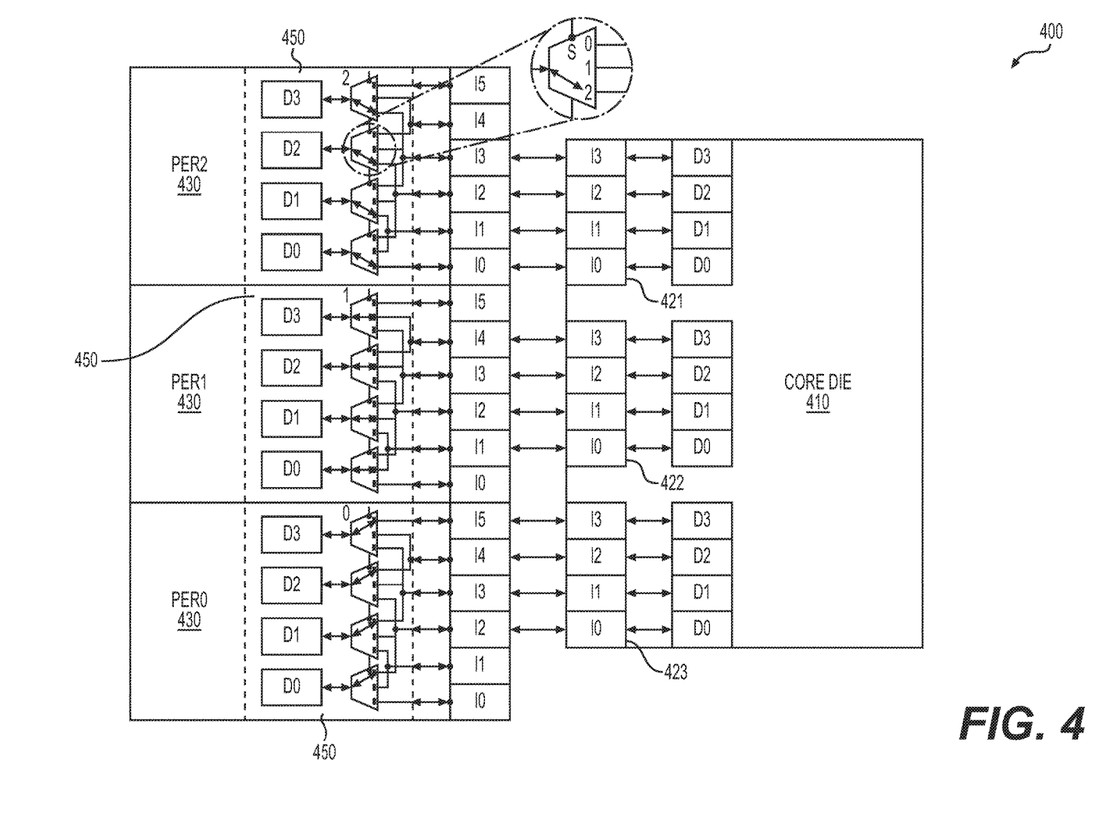
FIG. 4 shows a block diagram of another system 400 implemented using modular chips according to an embodiment of the disclosure.

FIG. 4 shows a block diagram of another system 400 implemented using modular chips according to an embodiment of the disclosure. The system 400 includes multiple dies, such as a core die 410, a plurality of peripheral dies 430 (e.g., PER0-PER2) and the like. Each of the peripheral dies 430 includes multiple interface circuits I0-I5, a switch circuit 450 and internal functional circuit (not shown). The switch circuit 450 is configured to select a portion (e.g., four out of six) of the multiple interface circuits I0-I5 and couple the selected interface circuits with the internal functional circuit.

In the FIG. 4 example, the core die 410 communicates 4-bit data in parallel with the peripheral dies 430. For example, the core die 410 includes core interface circuits 421 that interface the core die 410 with the peripheral die PER2, core interface circuits 422 that interface the core die 410 with the peripheral die PER1, and core interface circuits 423 that interface the core die 410 with the peripheral die PER0. The core interface circuits 421 includes four interface circuit units I0-I3 configured to transmit/receive data bits D0-D3 in parallel. Similarly, the core interface circuits 422 includes four interface circuit units I0-I3 configured to transmit/receive data bits D0-D3 in parallel, and the core interface circuits 423 includes four interface circuit units I0-I3 configured to transmit/receive data bits D0-D3 in parallel.

Each of the peripheral dies 430 includes multiple interface circuit units with redundancy. For example, each of the peripheral dies 430 includes six interface circuit units I0-I5. When the core die 410 and the peripheral dies 430 are disposed in a chip package, the interface redundancy provides placement flexibility for aligning interface circuits to enable high speed interconnections, thus the system 400 is implemented with minimum area and desired overall system performance for example.

In the FIG. 4 example, the peripheral dies 430 are placed to align the interface circuit units to the core interface circuits 421-423. For the peripheral die PER0, the interface circuit units I2-I5 are aligned with the core interface units I0-I3 of the core interface circuits 423. In an example, straight wire interconnections are used to interconnect the interface circuit units I2-I5 in the peripheral die PER0 and the core interface units I0-I3 of the core interface circuits 423. Further, the switch circuit 450 of the peripheral die PER0 selects the interface circuit units I2-I5 to provide 4-bit data to internal functional circuits. Specifically, in the FIG. 4 example, the switch circuit 450 includes four multiplexers. Each multiplexer receives inputs from three interface circuit units, and selects one of the three interface circuit units based on a selection signal (S). In the FIG. 1 example, when the selection signal S is "0", the interface circuit units I2-I5 are respectively selected by the four multiplexers for connecting with the 4-bit data D0-D3 in the peripheral die PER0.

Similarly, for the peripheral die PER1, the interface circuit units I1-I4 are aligned with the core interface units I0-I3 of the core interface circuits 422. In an example, straight wire interconnections are used to interconnect the interface circuit units I1-I4 in the peripheral die PER1 and the core interface units I0-I3 of the core interface circuits 422. Further, the switch circuit 450 of the peripheral die PER1 selects the interface circuit units I1-I4 to provide 4-bit data to internal functional circuit. Specifically, in the FIG. 4 example, the switch circuit 450 includes four multiplexers. Each multiplexer receives inputs from three interface circuit units, and selects one of the three interface circuit units based on a selection signal (S). In the FIG. 1 example, when the selection signal S is "1", the interface circuit units I1-I4 are respectively selected by the four multiplexers for connecting with the 4-bit data D0-D3 in the peripheral die PER1.

For the peripheral die PER2, the interface circuit units I0-I3 are aligned with the core interface units I0-I3 of the core interface circuits 421. In an example, straight wire interconnections are used to interconnect the interface circuit units I0-I3 in the peripheral die PER2 and the core interface units I0-I3 of the core interface circuits 421. Further, the switch circuit 450 of the peripheral die PER2 selects the interface circuit units I0-I3 to provide 4-bit data to internal functional circuits. Specifically, in the FIG. 4 example, the switch circuit 450 includes four multiplexers. Each multiplexer receives inputs from three interface circuit units, and selects one of the three interface circuit units based on a selection signal (S). In the FIG. 1 example, when the selection signal S is "2", the interface circuit units I0-I3 are respectively selected by the four multiplexers for connecting with the 4-bit data D0-D3 in the peripheral die PER2.

It is noted that, in an example, the internal functional circuits for the peripheral dies 430 includes SERDES configured to convert data between parallel data and serial data.

According to an aspect of the disclosure, using redundant peripheral circuits allows a same design of a core die to interface with different designs of peripheral dies.

Figure 5A:
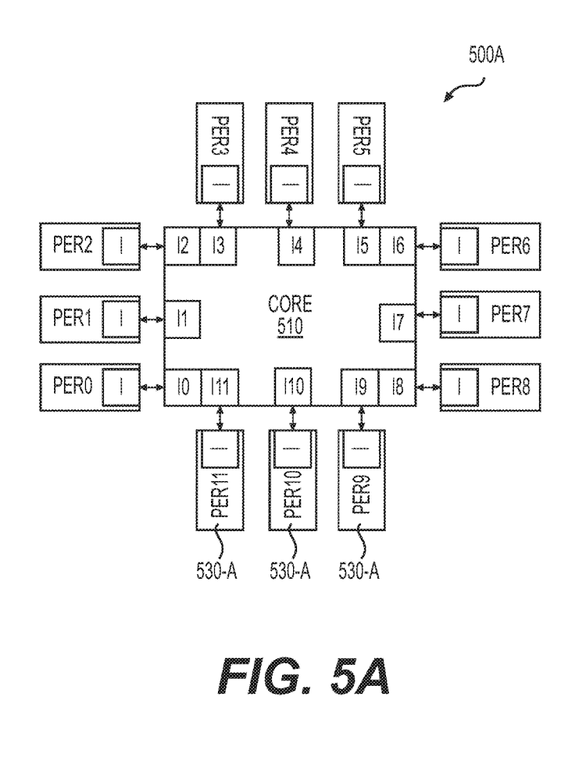
FIGS. 5A and 5B show products using core dies of a same design according to an embodiment of the disclosure.
Figure 5B:
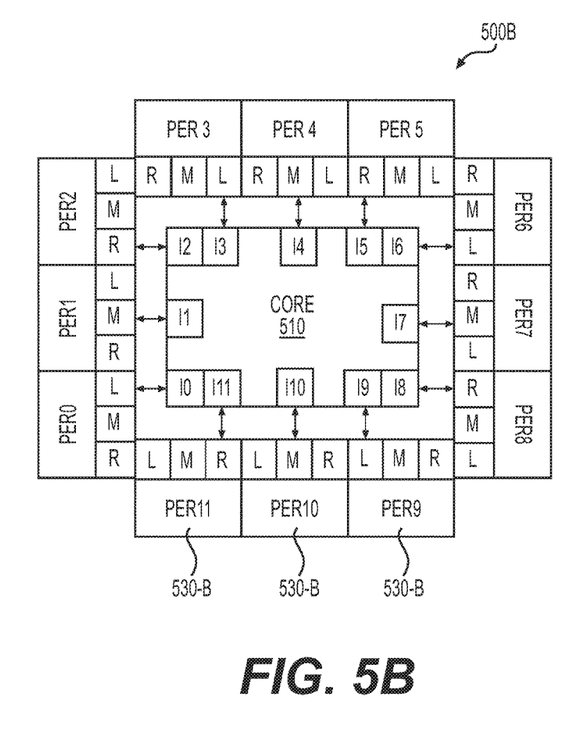

FIGS. 5A and 5B show systems 500A and 500B using core dies of a same design according to an embodiment of the disclosure. Each of the system 500A and the system 500B includes a core die 510 of the same design. The core die 510 operates similarly to the core die 210 described above. The core die 510 also utilizes certain components that are identical or equivalent to those used in the core die 210; the description of these components has been provided above and will be omitted here for clarity purposes.

In the FIG. 5A example, the system 500A includes twelve small peripheral dies 530-A. The small peripheral dies 530-A are disposed in the system 500A with flexibility to align interface circuits (I) of the peripheral dies 530-A with the core interface circuits I0-I11 of the core die 510. Thus, straight wire interconnections are used to interconnect the interface circuits I of the peripheral dies 530-A with core interface circuits I0-I11 of the core die 510.

In FIG. 5B, in an example, the system 500B is the same system as the system 200 and includes components that are identical or equivalent to those in the system 200; the description of the component and the system are omitted here for clarity purposes. The system 500B includes twelve relatively large peripheral dies 530-B compared to the small peripheral dies 530-A. The large size of the peripheral dies 530-B limits placement flexibility. However, each of the peripheral dies 530-B includes interface circuits with redundancy, such as multiple interface circuits L, M and R in FIG. 5B example. The redundancy provides flexibility for interface alignment, and makes possible to form straight wire interconnections.

Figure 6:
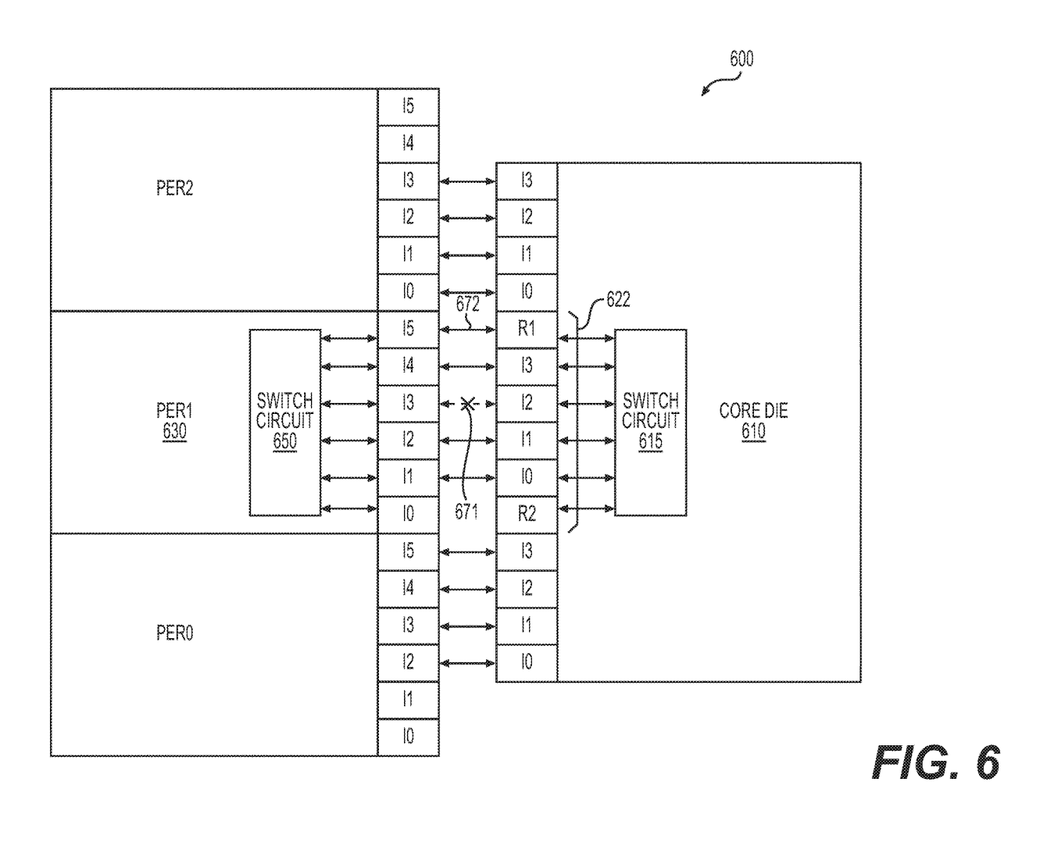
FIG. 6 shows a block diagram of another system 600 implemented using modular chips according to an embodiment of the disclosure.

FIG. 6 shows a block diagram of another system 600 implemented using modular chips according to an embodiment of the disclosure. The system 600 operates similarly to the system 400 described above. The system 600 also utilizes certain components that are identical or equivalent to those used in the system 400; the description of these components has been provided above and will be omitted here for clarity purposes.

In FIG. 6 example, the core interface circuit 622 includes the core interface units I0-I3, and one or more redundant interface units, such as redundant core interface units R1 and R2. Generally, the interface circuit units I1-I4 of the peripheral die PER1 are aligned to the core interface units I0-I3 of core interface circuits 622. In an example, straight wire interconnections are used between the interface circuit units I1-I4 in the peripheral die PER1 and the core interface units I0-I3 of the core interface circuits 622. However, when a production defect (by way of example only, a defect in I3 of PER1, a defect in I2 of the core interface circuit 622, a defect in the wire interconnection 671 and the like) causes a fault on the wire interconnection 671, the redundant interface units are used to improve system yield.

Specifically, in an example, a straight wire interconnection 672 is formed between the interface circuit unit I5 of the peripheral die PER1 and the redundant interface unit R1. Further, the switch circuit 650 is configured to de-select the interface circuit unit I3 and select the interface circuit unit I5. Similarly, the core die 615 includes a switch circuit 615. The switch circuit 615 is configured to de-select the core interface unit I2 and select the redundant interface unit R1.

Figure 7:
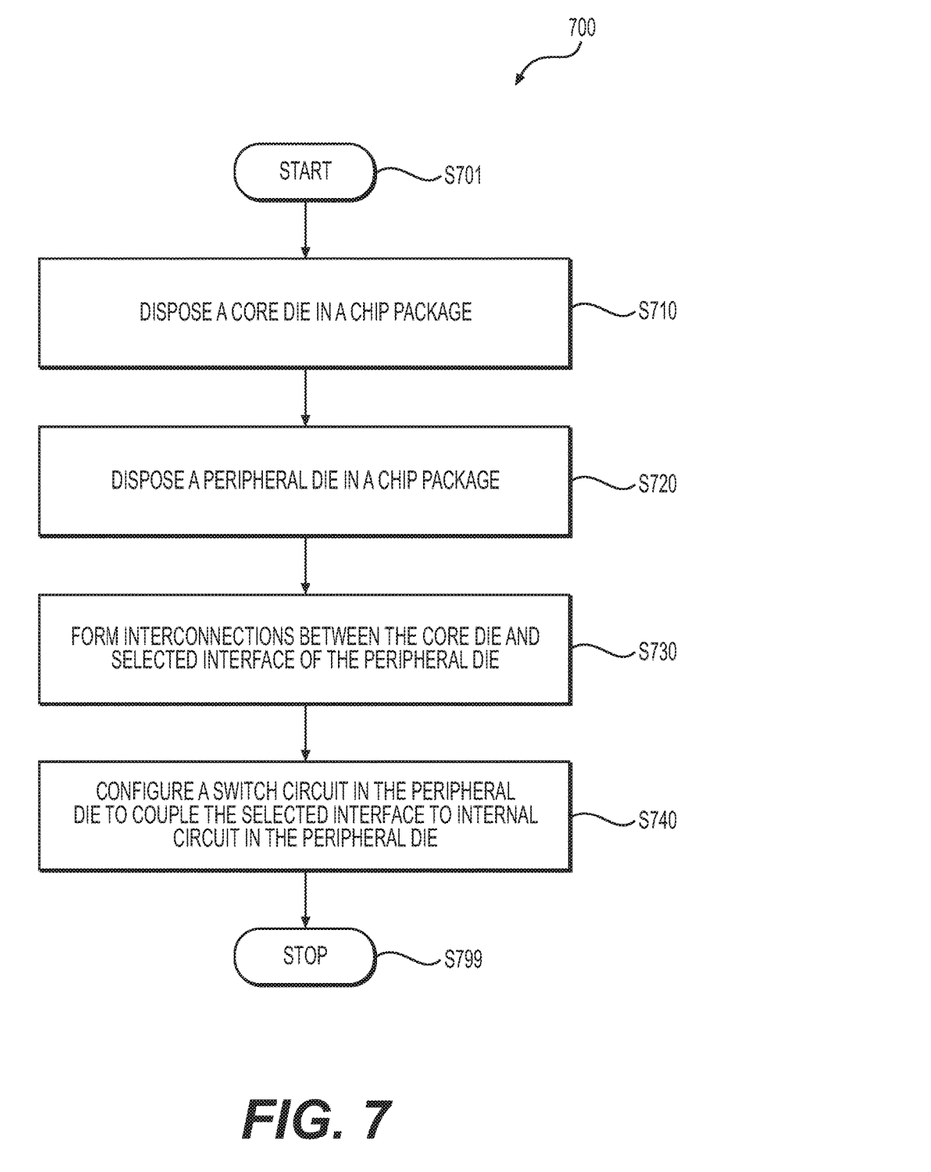
FIG. 7 shows a flow chart outlining a process 700 to form a system using modular chips according to an embodiment of the disclosure.

FIG. 7 shows a flow chart outlining a process 700 to form a system using modular chips according to an embodiment of the disclosure. In an example, the process 700 is used to form the system 100, the system 200, the system 300, the system 400, and the like. The process starts at S701, and proceeds to S710.

At S710, a core die is disposed in a chip package.

At S720, one or more peripheral dies are disposed in the chip package. According to an aspect of the disclosure, functions of a system are split into a core die and a plurality of peripheral dies. The core die and the peripheral dies are manufactured respectively using suitable manufacturing process that is optimized to improve respective yield. Then, the core die and the peripheral dies are assembled into a chip package. The peripheral dies include interface circuits with redundancy. The peripheral dies are disposed to align the interface circuits of the peripheral dies with the interface circuits of the core die. Due to the redundancy, the alignment of the interface circuits is performed with flexibility and ease without sacrificing the area of the core die. It is noted that, in an example, the plurality of peripheral dies are disposed in the chip package before the core die.

At S730, interconnections are formed between the core die and the peripheral dies. In an example, when the interface circuits of the peripheral dies are aligned with the interface circuits of the core die, straight wire (or nearly straight wire) interconnections are used to interconnect the interface circuits of the peripheral die with the interface circuits of the core die using minimum wire length. The straight wire interconnections provide fast transmission speed in an example compared to non-straight wire interconnections. In an embodiment, straight wire connections refers to connections of the shortest length between corresponding interface circuits in the respective core die and peripheral dies. Typically, the straight wire connections are perpendicular to the core die and/or the peripheral die.

At S740, switch circuits are configured to couple interface circuits in the peripheral dies based on the configuration of the interconnections. In an example, a switch circuit is configured to select the interface circuits that are coupled to the core interface units with straight wire interconnections, and couple the selected interface circuits to the functional circuit in the peripheral die. In another example, a switch circuit is configured to select the interface circuits that have passed a test, and couple the selected interface circuits to the functional circuit in the peripheral die. Then the process proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A chip package, comprising:
a first die having a processing circuit and a first interface circuit;
a second die disposed in a proximity to the first die and coupled to the first die, the second die comprising:
internal functional circuits;
two or more second interface circuits with an identical configuration, a specific second interface circuit being electrically connected to the first interface circuit via wires; and
a switch circuit configured to select the specific second interface circuit from the two or more second interface circuits, and couple bi-directionally the specific second interface circuit to the internal functional circuits on the second die.

2. The chip package of claim 1, wherein the first die is a core die, the first interface circuit is one of a plurality of core interface circuits, the second die is a first peripheral die in a plurality of peripheral dies, the second interface circuits are peripheral interface circuits, and the specific second interface circuit is a specific peripheral interface circuit.

3. The chip package of claim 1, wherein the first die is one of a plurality of peripheral dies, the first interface circuits are peripheral interface circuits, the second die is a core die, and the second interface circuits are core interface circuits.

4. The chip package of claim 2, wherein the specific peripheral interface circuit is aligned and connected to the core interface circuit on the core die.

5. The chip package of claim 4, wherein the specific peripheral interface circuit is connected to the core interface circuit on the core die via straight wires.

6. The chip package of claim 2, wherein the first peripheral die and a second peripheral die are produced with a same layout.

7. The chip package of claim 6, wherein the second peripheral die comprises:
- corresponding internal functional circuits;
- corresponding two or more peripheral interface circuits, a different peripheral interface circuit that is electrically connected to one of the core interface circuits via wires; and
- corresponding switch circuit configured to select the different peripheral interface circuit and to couple the different peripheral interface circuit to the corresponding internal functional circuits on the second peripheral die.

8. The chip package of claim 2, wherein the switch circuit is configured to select the specific peripheral interface circuit that passes a test, and couple the specific peripheral interface circuit to the internal functional circuits on the first peripheral die, and to decouple another peripheral interface circuit that fails the test.

9. The chip package of claim 2, wherein the switch circuit includes a multiplexer configured to receive inputs from multiple peripheral interface circuits, to select an input from the specific peripheral interface circuit based on a selection signal, and to couple the specific peripheral interface circuit to the internal functional circuits on the first peripheral die.

10. The chip package of claim 2, wherein the internal functional circuits are configured to convert between serial data and parallel data.

11. The chip package of claim 2, wherein the switch circuit is configured to select the specific peripheral interface circuit based on external interconnection configuration of the peripheral interface circuits.

12. The chip package of claim 2, wherein the processing circuit on the core die is configured to process packets, and the peripheral dies are configured to transmit/receive packets.

13. A method for producing a chip package, comprising:
- disposing a plurality of peripheral dies in a proximity to a core die having a processing circuit and a plurality of core interface circuits, at least a first peripheral die including two or more peripheral interface circuits;
- connecting a specific peripheral interface circuit from the two or more peripheral interface circuits to one of the core interface circuits via wires; and
- configuring a switch circuit in the first peripheral die to couple bi-directionally the specific peripheral interface circuit to internal functional circuits on the first peripheral die.

14. The method of claim 13, wherein disposing the plurality of peripheral dies in the proximity to the core die having the processing circuit and the plurality of core interface circuits comprises:
- aligning the specific peripheral interface circuit to a corresponding core interface circuit on the core die.

15. The method of claim 14, further comprising:
- forming straight wires to interconnect the specific peripheral interface circuit and the core interface circuit.

16. The method of claim 13, further comprising:
- determining that a test is passed by the specific peripheral interface circuit but failed by another peripheral interface circuit; and
- configuring the switch circuit to decouple the other peripheral interface circuit and couple the specific peripheral interface circuit to the internal functional circuits.

17. The method of claim 13, wherein configuring the switch circuit in the first peripheral die to couple the specific peripheral interface circuit to internal functional circuits on the first peripheral die further comprises:
- providing a selection signal to a multiplexer in the switch circuit to select an input from the specific peripheral interface circuit as an output of the multiplexer.

18. The method of claim 13, wherein configuring the switch circuit in the first peripheral die to couple the specific peripheral interface circuit to internal functional circuits on the first peripheral die further comprises:
- configuring the switch circuit to select the specific peripheral interface circuit based on external interconnection configuration of the peripheral interface circuits.

19. An integrated circuit chip, comprising:
- internal functional circuits;
- two or more peripheral interface circuits with an identical configuration; and
- a switch circuit configured to be controllable to select at least one of the peripheral interface circuits, and to couple bi-directionally the selected at least one peripheral interface circuit to the internal functional circuits.

20. The integrated circuit chip of claim 19, wherein the switch circuit includes a multiplexer configured to receive inputs from multiple peripheral interface circuits, select an input from the specific peripheral interface circuit based on a selection signal, and couple the specific peripheral interface circuit to the internal functional circuits.

21. The integrated circuit chip of claim 19, wherein the internal functional circuits are configured to convert between serial data and parallel data.

22. The integrated circuit chip of claim 19, wherein the switch circuit is configured to select the at least one of the peripheral interface circuits based on external interconnection configuration of the peripheral interface circuits.

* * * * *